United States Patent
Riani et al.

(10) Patent No.: US 10,326,550 B1
(45) Date of Patent: Jun. 18, 2019

(54) SOFT FEC WITH PARITY CHECK

(71) Applicant: INPHI CORPORATION, Santa Clara, CA (US)

(72) Inventors: Jamal Riani, Fremont, CA (US); Benjamin Smith, Ottawa (CA); Volodymyr Shvydun, Los Altos, CA (US); Sudeep Bhoja, San Jose, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/691,023

(22) Filed: Aug. 30, 2017

(51) Int. Cl.
*H04L 1/00* (2006.01)
*H03M 13/29* (2006.01)
*H03M 13/15* (2006.01)

(52) U.S. Cl.
CPC ...... *H04L 1/0041* (2013.01); *H03M 13/1515* (2013.01); *H03M 13/2906* (2013.01)

(58) Field of Classification Search
CPC ............ H04L 1/0041; H03M 13/1515; H03M 13/2906
See application file for complete search history.

(56) References Cited

U.S. PATENT DOCUMENTS

| | | | | | |
|---|---|---|---|---|---|
| 4,009,347 | A | * | 2/1977 | Flemming | H04B 7/18528 370/321 |
| 2007/0115803 | A1 | * | 5/2007 | Geile | G06F 17/14 370/208 |
| 2012/0076183 | A1 | * | 3/2012 | Dapper | H03M 13/356 375/219 |

OTHER PUBLICATIONS

A. Duel-Hallen, "Equalizers for multiple input/multiple output channels and PAM systems with cyclostationary input sequences," in IEEE Journal on Selected Areas in Communications, vol. 10, No. 3, pp. 630-639, Apr. 1992.*
IEEE Draft Standard for Ethernet Amendment 10: Media Access Control Parameters, Physical Layers and Management Parameters for 200 Gb/s and 400 Gb/s Operation, in IEEE P802.3bs(TM)/D3. 23.3, Jul. 2017, vol., No., pp. 1-393, Jan. 1, 2017.*

* cited by examiner

*Primary Examiner* — Cynthia Britt
(74) *Attorney, Agent, or Firm* — Richard T. Ogawa; Ogawa P.C.

(57) ABSTRACT

The present invention is directed to data communication systems and techniques thereof. More specifically, embodiments of the present invention provide an FEC encoder that generates parity symbols that are embedded into FEC blocks. An FEC decoder determines whether to perform error correction based on the parity symbols. When performing error correction, the decoder selects a worst symbol from a segment of symbols, and the worst symbol is corrected. There are other embodiments as well.

9 Claims, 9 Drawing Sheets

SOFT FEC WITH PARITY CHECK

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to data communication systems and techniques thereof.

Over the last few decades, the use of communication networks has exploded. In the early days of the Internet, popular applications were limited to emails, bulletin board, and mostly informational and text-based web page surfing, and the amount of data transferred was relatively small. Today, the Internet and mobile applications demand a huge amount of bandwidth for transferring photo, video, music, and other multimedia files. For example, a social network like Facebook processes more than 500 TB of data daily. With such high demands on data storage and data transfer, existing data communication systems need to be improved to address these needs.

There are both existing and proposed standards and protocols for data communication. One of the proposed data communication protocol is 802.3bs, which is intended for high speed data transfer. Improving various aspects of high speed communication techniques (e.g., 802.3bs protocol) is desired.

BRIEF SUMMARY OF THE INVENTION

The present invention is directed to data communication systems and techniques thereof. More specifically, embodiments of the present invention provide an FEC encoder that generates parity symbols that are embedded into FEC blocks. An FEC decoder determines whether to perform error correction based on the parity symbols. When performing error correction, the decoder selects a worst symbol from a segment of symbols, and the worst symbol is corrected. There are other embodiments as well.

According to an embodiment, the present invention provides a data transmission device, which includes a first Reed-Solomon (RS) encoder for generating a first data stream. The first data stream is characterized by a first block size. The device also includes a second RS encoder for generating a second data stream. The second data stream is characterized by the first block size. The device further includes a first multiplexer for distributing the first data stream and the second data stream into a first plurality of data streams. The first plurality of data streams includes a third data stream and a fourth data stream. The third data stream includes data blocks from the first data stream and the second data stream. The device additionally includes a first plurality of communication lanes for transmitting the first plurality of data streams. The device further includes a second multiplexer for distributing the first plurality of data streams into a second plurality of data streams. The second plurality of data streams includes a fifth data stream. The fifth data stream includes data blocks from the third data stream and fourth data stream. The device additionally includes a second plurality of communication lanes for transmitting the second plurality of data streams. The second plurality of communication lanes includes a first communication lane. The device further includes a third multiplexer for splitting the fifth data stream into a first odd data stream and a first even data stream. The device also includes a first amplitude modulation (AM) lock module for locking a plurality of odd RS symbols based on the first odd data stream. The device includes a second AM lock module for locking a plurality of even RS symbols based on the first even data stream. The device also includes an encoder module for generating a plurality of forward-error correction (FEC) blocks. Each of the FEC blocks includes an odd section and an even section and a parity section. The parity section has an odd parity bit corresponding to the odd section and an even parity bit corresponding to the even section.

According to another embodiment, the present invention provides a decoding device, which has a communication interface for receiving a data stream comprising a plurality of PAM symbols. The device also includes a mapping module for generating an FEC block based the plurality of PAM symbols. The FEC block consists of n symbols, which has a parity symbol and a plurality of odd symbols and a plurality of even symbols. The device also includes a decoding module that is configured to perform parity check using the parity symbol and the odd symbols. Decoding module is further configured to determine a validity based on the parity symbol and the plurality of odd symbols. The decoding module is also configured to select a worst odd symbol if the parity symbol indicates a parity mismatch with odd symbols. The decoding module is further configured to modify the worst odd symbol based on a second closest eye level.

According to yet another embodiment, the present invention provides a method of decoding PAM communication data. The method includes receiving a data stream comprising a plurality of PAM symbols. The method also includes generating an FEC block based the plurality of PAM symbols. The FEC block consists of n symbols that includes a parity symbol and a plurality of odd symbols and a plurality of even symbols. The parity symbol includes an odd parity bit and an even parity bit. The method also includes calculating relative parity between the even parity bit and the plurality of even symbols. If the parity symbol indicates a parity mismatch with the plurality of even symbols, the method further includes calculating log-likelihood ratio values for each of the even symbols. The method also includes selecting a worst even symbol based on a lowest log-likelihood ratio value. The method further includes determining two closest eye levels for the worst even symbol. The two closest eye levels include a first closes eye level and second closest eye level. The method also includes modify the worst even symbol based on a second closest eye level.

It is to be appreciated that embodiments of the present invention provide many advantages over conventional techniques. Among other things, encoder and decoder modules according to embodiments of the present invention can be easily adopted into existing systems. For example, in a PAM4 based high-speed data communication system (e.g., 802.3bs), encoder and decoder modules are implemented as outer modules that add onto existing communication chips with RS encoding scheme. The addition of parity symbol FEC according to embodiments of the present invention adds little transmission overhead (1/21), and low-power implementation can be achieved. As explained above, FEC techniques according to the present invention can readily provide over 1.5 dB of coding gain.

Embodiments of the present invention can be implemented in conjunction with existing systems and processes. For example, parity symbol based error check and correction can be easily adapted into existing communication system. Encoding and decoding modules according to embodiments of the present invention can be readily manufactured using existing manufacturing processes and systems. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1A:
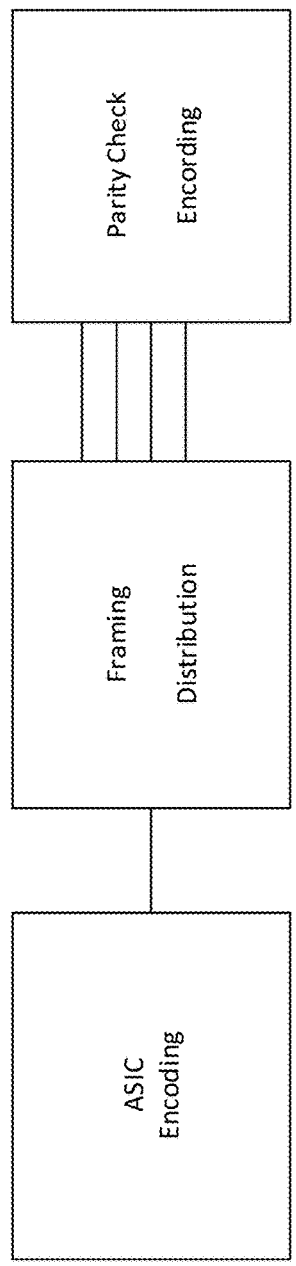
FIG. 1A is a simplified block diagram illustrating a data transmission device according to an embodiment of the present invention.

The present invention is directed to data communication systems and techniques thereof. More specifically, embodiments of the present invention provide an FEC encoder that generates parity symbols that are embedded into FEC blocks. An FEC decoder determines whether to perform error correction based on the parity symbols. When performing error correction, the decoder selects a worst symbol from a segment of symbols, and the worst symbol is corrected. There are other embodiments as well.

As explained above, it is desirable to improve data rate and accuracy in data communication systems. For example, in high-speed data communication systems, Reed-Solomon (RS) encoding is often used. In various embodiments, the present invention take advantage of existing encoding scheme sand uses parity symbol to improve accuracy and performance of data transmission.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1A is a simplified block diagram illustrating a data transmission device according to an embodiment of the present invention. This diagram is merely an example, which should not unduly limit the scope of the claims. One of ordinary skill in the art would recognize many variations, alternatives, and modifications. As shown in FIG. 1A, at the top level, an ASIC section encodes signals for transmission. For example, RS encoding is performed. The framing and distribution section encodes signals that are framed into data blocks and distributes the data blocks to different communication channels. The parity check and encoding section performs parity check and inserts parity bits into data blocks.

Figure 1B:
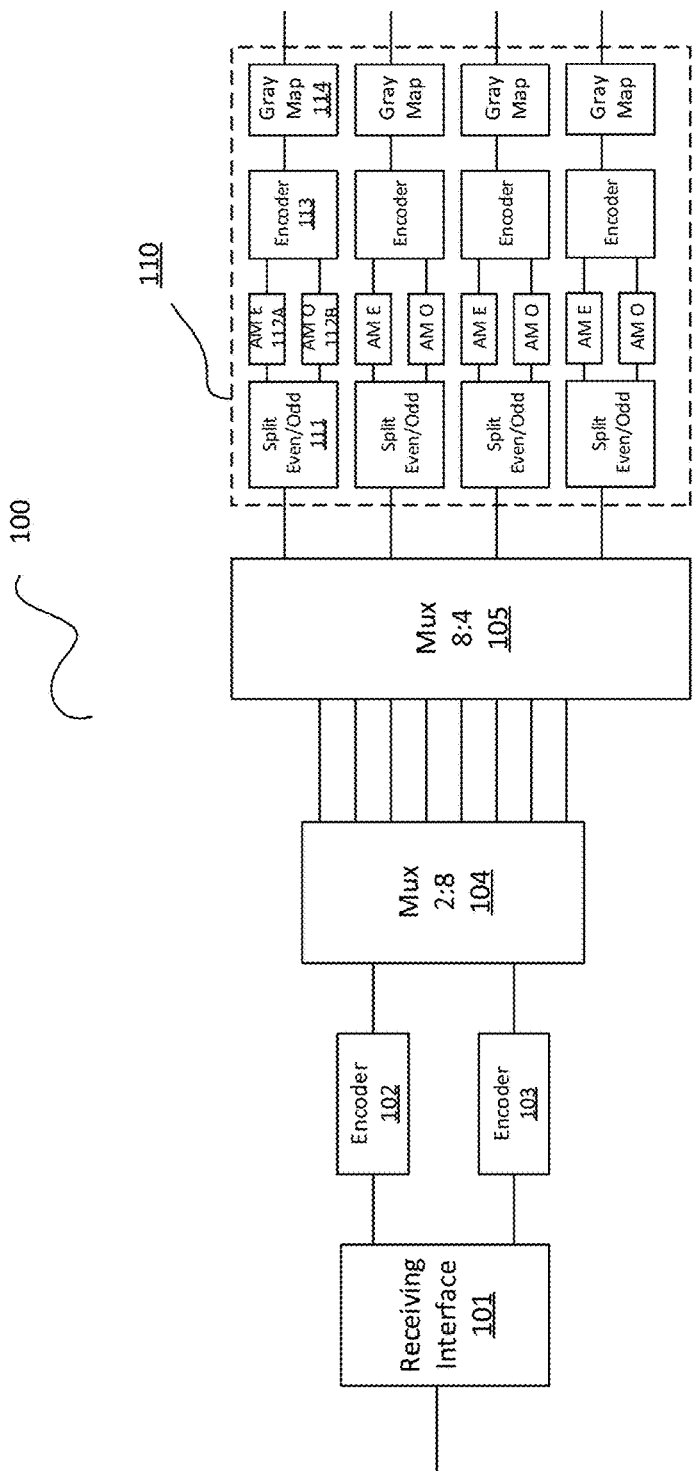
FIG. 1B is a simplified diagram illustrating a data transmission device 100 according embodiments of present invention.

FIG. 1B is a simplified diagram illustrating a data transmission device 100 according embodiments of present invention. This diagram is merely an example, which should not unduly limit the scope of the claims. One of ordinary skill in the art would recognize many variations, alternatives, and modifications. In various embodiments, the data transmission device is configured in compliance with 802.3bs standard, but it is understood that other communication standards and protocols may be used as well. For example, the data transmission device 100 can be configured for transmitting data at a rate of 400 Gbps or higher. Data at a high transmission rate are received and processed by receiving interface 101. For example, data may be received via copper wires and/or optical communication channels. The received data are encoded by encoder 102 and encoder 103. According to various embodiments, encoder 102 comprises Reed-Solomon (RS) encoder that encodes and generates a first data stream. For example, the first data stream is divided into 10-bits blocks, which may be specified by a predetermined encoding scheme. For example, the RS encoder uses RS (544, 514) encoding scheme. Similarly, encoder 103 is (similar to encoder 102) implemented with an RS encoder to generate a second data stream with 10-bits blocks. The first data stream and the second data stream, respectively generated by encoder 102 and encoder 103, are distributed into eight communication lanes by multiplexer 104. For example, each of the eight communication lanes transmits data blocks from both the first data stream and the second data stream. In various embodiments, the eight communication lanes are physical coding sublayer (PCS) lanes, and each of the eight communication lanes transmits data from both the first data stream and the second data stream. For example, data blocks from the first data stream and the second data stream can be interleaved according to a predetermined pattern. Multiplexer 105 distributes data streams from the eight communication lanes into four communication lanes. For example, the four communication lanes can be CDAUI lanes. It is to be appreciated that according to embodiments of the present invention, interface 101, encoder 102, encoder 103, multiplexer 104, and multiplexer 105 are configured as components of a host chip. For example, encoder module 110 is implemented as a separate chip that is coupled to the host chip. Encoder module 110 provides forward error correction (FEC) that reduces bit-error rate (BER) and improves performance.

As shown in FIG. 1B, encoder module 110 includes four encoder lanes, which correspond to the four communication lanes from multiplexer 105. For example, the four encoder lanes perform encoding in parallel, and the encoder module 110 is substantially insensitive to PCS lane skews. Data streams on each of four communication lanes include data blocks encoded by both encoder 102 and encoder 103. As described above, each of the data blocks includes 10 bits. At encoder module 110, each of the encoder lanes includes a splitter module, a pair of amplitude modulation (AM) lock modules, an encoder module, and a Gray mapping module. More specifically, an encoder lane of the encoder module 110 first splits the incoming data streams into even and odd bits. As an example, splitter module 111 splits a data stream from multiplexer 105 into even and odd bits. Even bits are then processed by even AM ("AM E" in FIG. 1B) lock module 112A, and odd bits are processed by odd AM ("AM O") lock module 112B. The AM lock modules 112A and 112B are configured to determine and lock boundary for RS symbols by using amplitude modulation techniques. For example, AM lock module 112A generates a stream of even data blocks, and AM lock module 112B generates a stream of odd data blocks. Encoder 113 encodes even data blocks and odd data blocks into forward-error correction (FEC) blocks. In various embodiments, each of the FEC blocks includes an even section, an odd section, and a parity section. The even section includes ten even data blocks (e.g., PAM4 symbols). The odd section includes ten odd data sections. The parity section includes an even parity bit corresponding to the even section and an odd parity bit corresponding to the odd section. For example, the parity section is later mapped into a PAM4 parity symbol. The Gray mapping module 114 maps FEC blocks into an output data stream for transmission. For example, the output data stream can be transmitted through various types of communication links at high speed.

Figure 2:
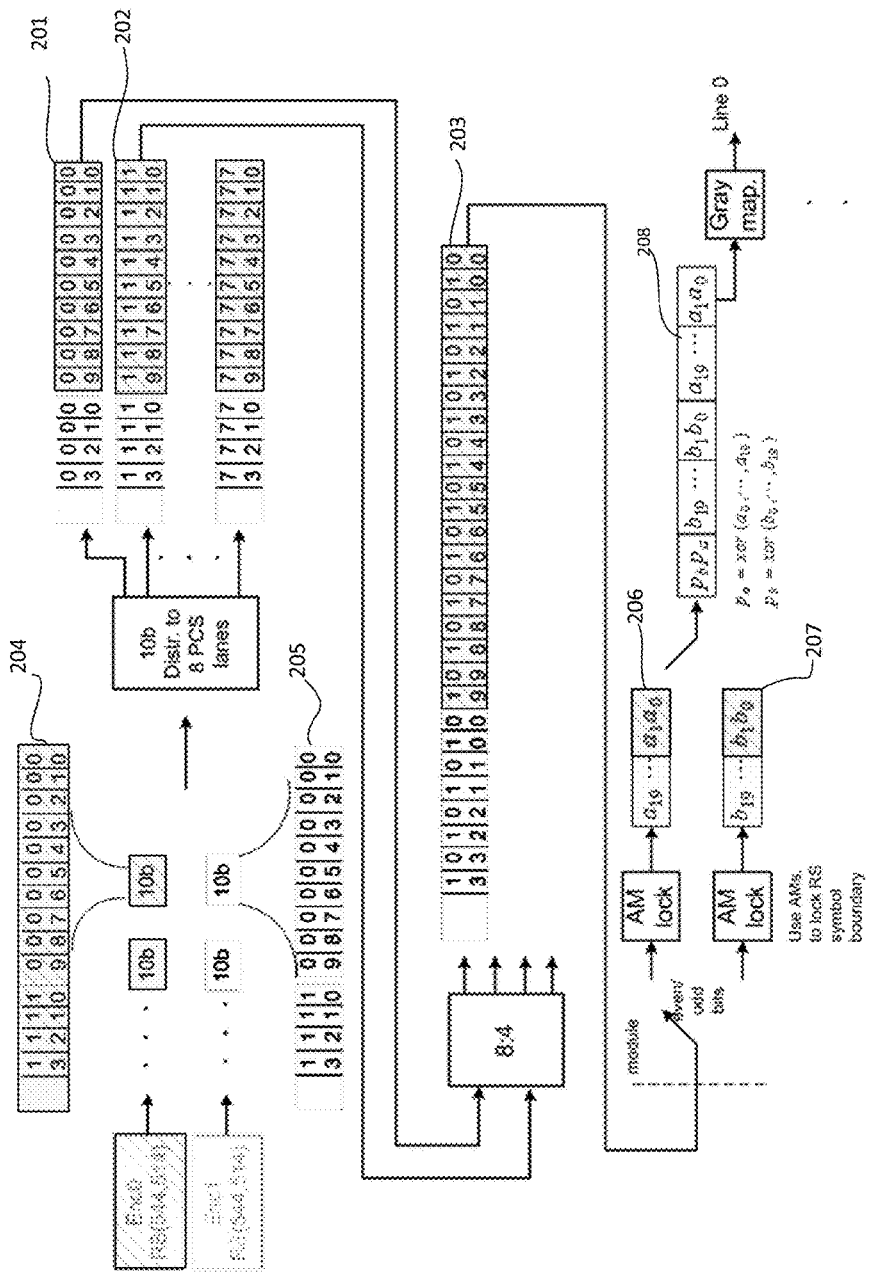
FIG. 2 is a simplified diagram illustrating data encoding according to embodiments of the present invention.

FIG. 2 is a simplified diagram illustrating data encoding according to embodiments of the present invention. This diagram is merely an example, which should not unduly limit the scope of the claims. One of ordinary skill in the art would recognize many variations, alternatives, and modifications. For example, FIG. 2 can be used to illustrate operation of data transmission device 100. As shown in FIG. 2, two encoders (Enc0 and Enc1) generate two data streams 204 and 205 as shown, and each of the data streams includes 10-bit data blocks. For example, shaded bits are generated by Enc0 and non-shaded bits are generated by Enc1. The two data streams 204 and 205 are then distributed to eight communication lanes (e.g., 8 PCS lanes) as eight data streams. It is to be appreciated that the encoded data can be distributed and multiplexed in other ways, and FIG. 2 merely provides a specific example. For example, data stream 201 includes alternating 10-bit data blocks from both data streams 204 and 205; data stream 202 also includes alternating 10-bit data blocks from both data streams 204 and 205. The eight data streams from the eight PCS lanes are then distributed by the 8:4 multiplexer as shown. An exemplary arrangement of data blocks is shown. Data stream 203 combines (or interleave) data blocks from data streams 201 and 202. More specifically, data stream 203 includes interleaved blocks of data blocks from data stream 201 and 202.

As described above, the four data streams are then encoded by the encoding module. For example, data stream 203 (one of the four data streams) is split into an even data stream 206 and an odd data stream 207. In various implementations, data stream 206 includes segments of even data bit symbols (e.g., 10 data symbols $a_0$ to $a_{19}$); data stream 207 includes segments of odd data bit symbols (e.g., 10 data symbols $b_0$ to $b_{19}$). The data symbols are provided by amplitude modulation locking modules, where the symbols are locked based on RS symbol boundary. Data streams 206 and 207 are then encoded and combined. For example, FEC encoding is performed on data streams 206 and 207. The resulting data stream 208 includes FEC blocks. In various implementations, FEC data blocks each includes 21 symbols: 10 even symbols, 10 odd symbols, and a parity symbol. For example, the even symbols (e.g., symbol $a_1a_0$) are positioned in a continuous segment, and the odd symbols (e.g., symbol $b_1b_0$) are positioned in a continuous segment adjacent to the even segment. The parity symbol includes two parity bits: $p_a$ corresponding to even segment 206, and $p_b$ corresponding to the odd segment 207. The FEC blocks are then mapped using Gray mapping for transmission. For example, the FEC blocks are transmitted using PAM protocol. For example, PAM4 may be used for data transmission. For data transmission, the parity symbol can provide a coding gain of about 1.65 dB.

It is to be appreciated that the use of parity symbols as a part of the encoding module can be implemented to compliment 802.3bs data communication systems. For example, on the communication lane, 21 PAM4 symbols meet two even parity constraints. The addition of parity symbols increases the data rate of the communication line. For example, the data rate increase from 26.5625e9 to 26.5625e9*21/20=27.890625 GHz. And in implementation, four 52 Gb/s Rx/DSP cores operate in parallel.

Embodiments of the present invention provide decoding devices and techniques to take advantage of encoding techniques described above. For example, a decoder module determines the existence of error at a given FEC block using the parity symbol. A maximum likelihood decoder is then used to locate the error symbol within the FEC block, and the error symbol is corrected using a "flip" function, which is described in further detail below.

An FEC block (e.g., FEC block 208) in FIG. 2, which is encoded with a parity symbol, includes 21 symbols. For example, after performing Gray mapping, PAM4 symbols transmitted over a communication includes one (21, 20) FEC block as [$d_0$, $d_1$, . . . , $d_{20}$], where $d_{20}$ is the parity symbol resulting from the Gray mapping of the 2 parity bits. For example, $d_0$-$d_9$ correspond to even blocks in FIG. 2, $d_{10}$-$d_{19}$ correspond to odd blocks, and $d_{20}$ corresponds to the parity block. By definition $d_0$ is the first transmitted symbol and $d_{20}$ is the last one. The two even parity constraints can be expressed, after Gray mapping, in terms of PAM4 symbols $d_i$, using Equation 1 below:

$$\oplus_{i=0}^{9} d_i[0] = d_{20}[0] \oplus d_{20}[1] \quad \text{(par1)}$$

$$\oplus_{i=10}^{19} d_i[0] = pol \oplus d_{20}[1] \quad \text{(par2) Equation 1:}$$

In Equation 1, the symbol $\oplus$ (xor) denotes additions and pol is a polarity inversion flag based on the polarity inversion. For example, polarity inversion detection is used as a part of the FEC word synchronization.

Figure 3:
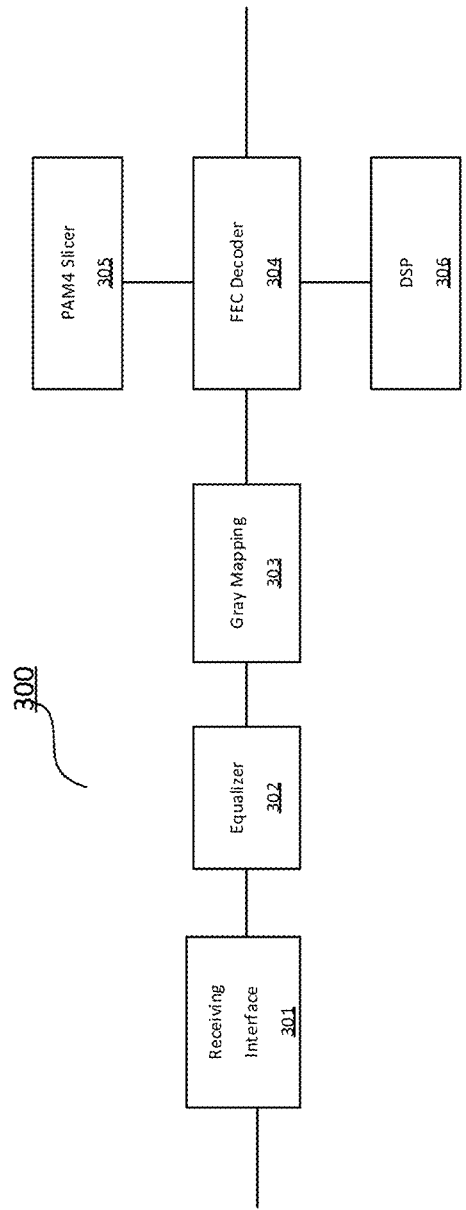
FIG. 3 is a simplified diagram illustrating a receiver device according to an embodiment of the present invention.

FIG. 3 is a simplified diagram illustrating a receiver device according to an embodiment of the present invention. This diagram is merely an example, which should not unduly limit the scope of the claims. One of ordinary skill in the art would recognize many variations, alternatives, and modifications. For example, receiver device 300 processes signals received from data transmission device 100 illustrated in FIG. 1B. More specifically, receiver device 300 uses parity symbols for error correction.

Incoming data are received through receiving interface 301. Equalizer 302 processes (e.g., equalization) the incoming data for further processing. Gray mapping is performed by the Gray mapping module 303, which yields PAM4 symbols. The PAM4 symbols are grouped into FEC blocks. As explained above, a single FEC block includes 21 symbols: 10 odd symbols, 10 even symbols, and a parity symbol. For example, based on the final equalizer output $x_i$, the FEC decoder 304 first achieves FEC block synchronization. Usually, the synchronization process is not overly complex. For example, after equalization and synchronization, FEC blocks processed by FEC decoder 304 are provided as [$x_0$, $x_1$, . . . , $x_{20}$]. The FEC decoder 304 receives 21 PAM4 preliminary decisions, $d_i$, from the PAM4 slicer 305, where each $d_i$ symbol is 2-bit binary. FEC decoder 304 further receives three optimal threshold values for each one the 3 sub-eyes (of the four PAM4 eye levels) from DSP 306.

For the purpose of illustration, threshold for the eye levels are denoted as Th(eye id), where eye id=0,1,2. In an exemplary implementation, Th(0) and Th(2) are 9.6 and Th(1) is 7.6. For each of the 21 symbols in an FEC block, there are corresponding 21 2-bit 2b eye_id$\in\{0, 1, 2\}$, and each is denoted as $E_i$. For example, $E_i$ indicates the sub-eye at which belongs sample $x_i$. For example, by having sign of the error signal for all bauds (e.g., generated by DSP 306), $E_i$ can be easily determined. In various embodiments, a single bit polarity inversion pol is used.

As explained above, FEC decoder 304 uses the parity symbol to determine whether error correction is to be performed. And if error correction is to be performed based on the parity symbol, the symbol with the highest likelihood to be erroneous is "flipped". To locate the erroneous bit, log likelihood ratio (LLR) calculation is performed for each data symbol $x_i$ of the given FEC block. The data symbol corresponding the lowest LLR value within a data segment is selected as the "worst" symbol and most likely to be erroneous. The PAM4 levels after equalization are denoted as L(d) and the noise variance per level is denoted as $\sigma^2(d)$. Knowing the coding of FEC is much smaller than 6 dB, the decoder is configured to only flip PAM4 symbols within the same sub-eye. Given $x_i$ and $d_i$ and if we denote $d'_i$ for the other PAM4 symbol from the same sub-eye $E_i$, the value of log-likelihood ratio (LLR) be expressed by Equation 2 below:

$$LLR(x_i) = \left[\left(\frac{1}{\sigma(d_i)} + \frac{1}{\sigma(d'_i)}\right)x_i - \frac{L(d'_i)}{\sigma(d'_i)} - \frac{L(d_i)}{\sigma(d_i)}\right] \times \left[\left(\frac{1}{\sigma(d'_i)} - \frac{1}{\sigma(d_i)}\right)x_i - \frac{L(d'_i)}{\sigma(d'_i)} + \frac{L(d_i)}{\sigma(d_i)}\right] \quad \text{Equation 2}$$

For example Equation 2 can be simplified to Equation 3 below:

$$LLR(x_i) = K(E_i) \times (x_i - Th(E_i)) \quad \text{Equation 3:}$$

where, $$K(E_i) = \left(\frac{1}{\sigma(d_i)} + \frac{1}{\sigma(d'_i)}\right) \times \left|\frac{L(d_i)}{\sigma(d_i)} + \frac{L(d'_i)}{\sigma(d'_i)}\right|$$

Figure 4:
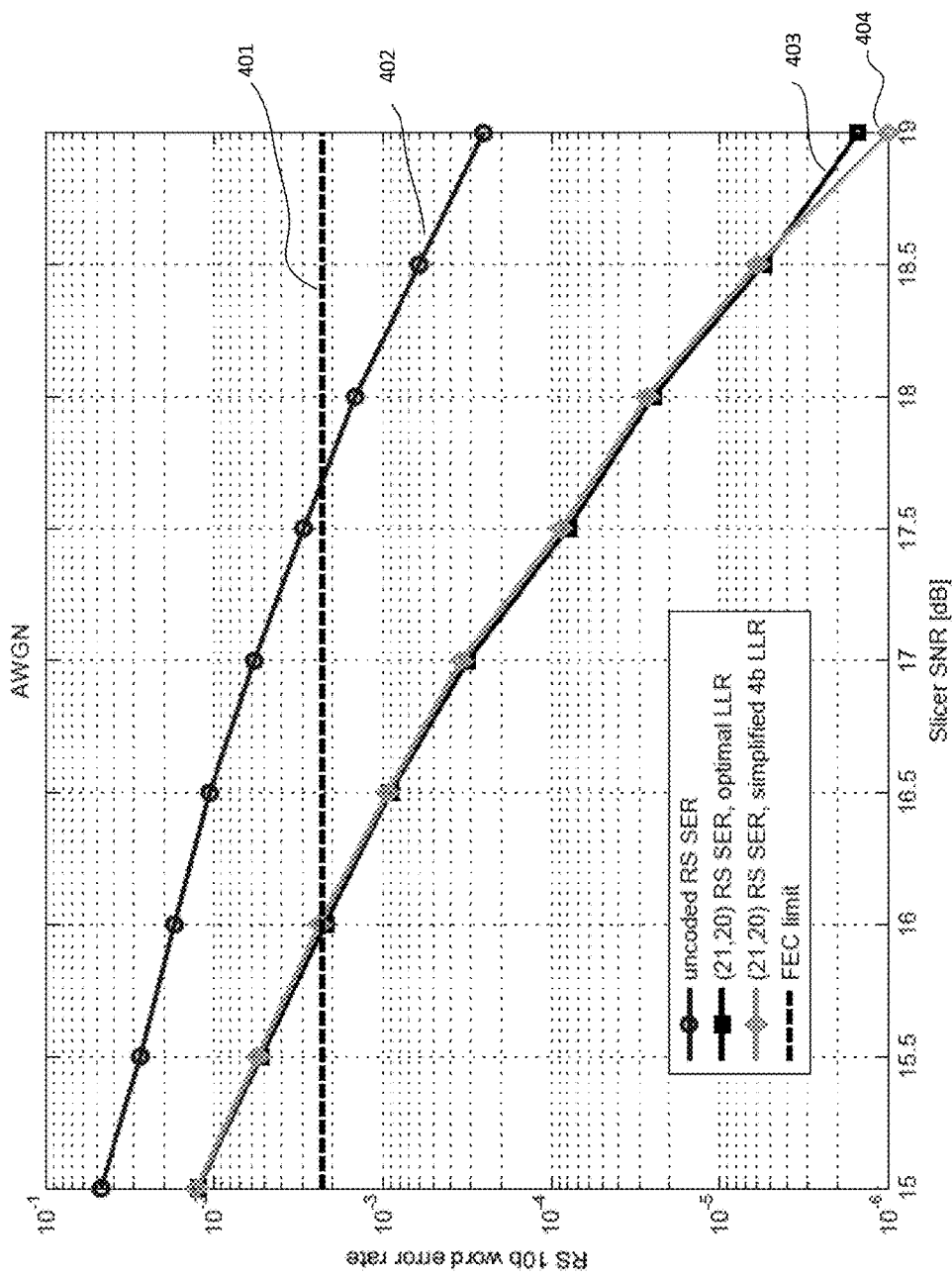
FIG. 4 is a graph illustrating benefits of using LLR values in error corrections.

The term K(Ei) in Equation 3 intuitively conveys the sub-eye SNR information. The closer $x_i$ is from the corresponding threshold, the lower LLR gets. FIG. 4 is a graph illustrating benefits of using LLR values in error corrections. More specifically, FIG. 4 illustrates RS 10-bit word error rate versus slicer SNR (or PAM4). As can be seen in FIG. 4, the FEC limit shown as dash line 401. The error rate associated with decoding with optimal LLR is illustrated by curve 403. The error rate associated with decoding with simplified 4-bit LLR is illustrated by curve 404. As graph in FIG. 4 clearly demonstrates, the error rates associated with decoding that uses LLR (optimal or simplified 4-bit) are much lower than error rate associated with uncoded RS (curve 402).

Figure 5:
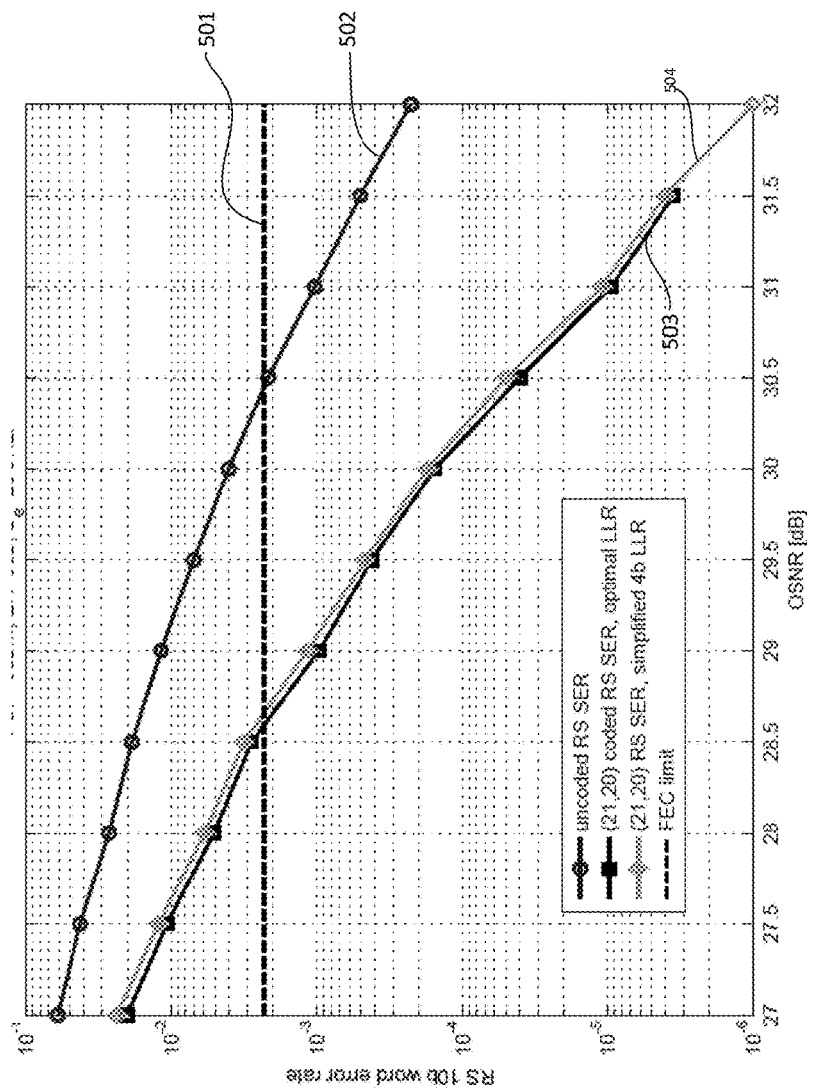
FIG. 5 is a graph illustrating relationship between RS symbol error rate versus PAM4 Optical Signal-To-Noise Ratio (OSNR).

FIG. 5 is a graph illustrating relationship between RS symbol error rate versus PAM4 Optical Signal-To-Noise Ratio (OSNR). The FEC limit shown as dash line 501. The error rate associated with decoding with optimal LLR is illustrated by curve 503. The error rate associated with decoding with simplified 4-bit LLR is illustrated by curve 504. The benefit of using LLR values is clear in the context of optical communication: the error rates associated with decoding that uses LLR (optimal or simplified 4-bit) are much lower than error rate associated with uncoded RS (curve 502).

Concerning the range of SNR (e.g., FIG. 4) and OSNR (e.g., FIG. 5) of interest, one could ignore the eye-dependent term $K(E_i)$ and truncate the LLR to a relatively low resolution. Also, because the decoding scheme only requires the absolute value of LLR, the term abs($x_i$-Th($E_i$)) can be truncated to low resolution and possibly saturated. The terms ($x_i$-Th($E_i$)) are already computed as part of the slicer logic.

Figure 6:
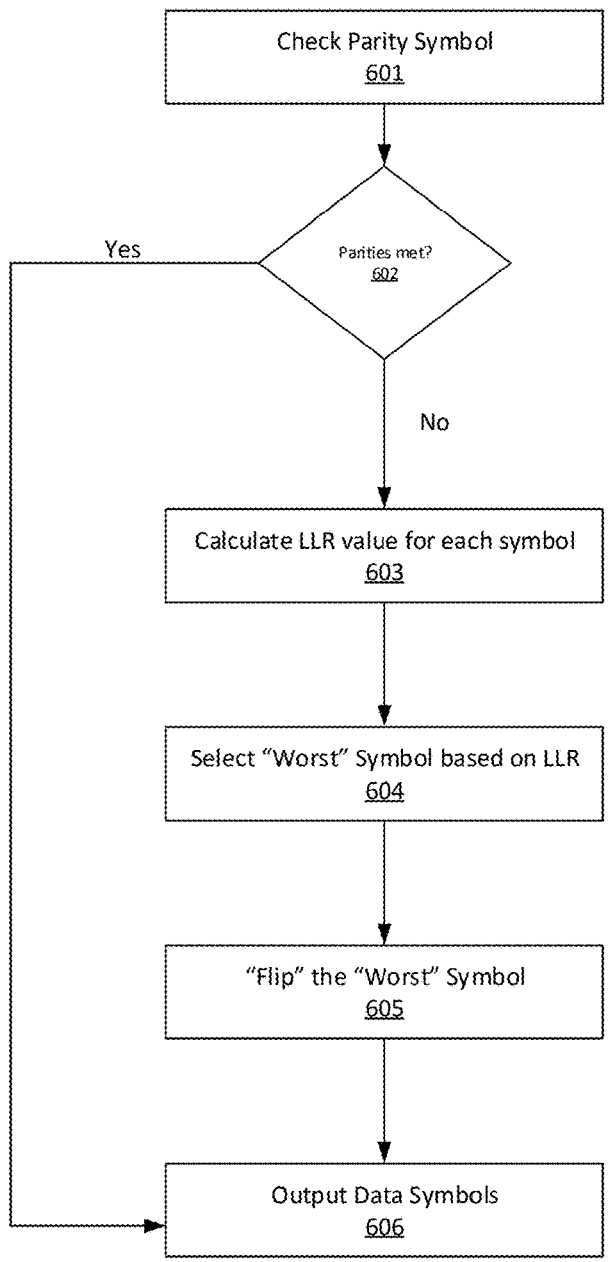
FIG. 6 is a simplified flow diagram illustrating an exemplary decoder error correction technique according to embodiments of the present invention.

FIG. 6 is a simplified flow diagram illustrating an exemplary decoder error correction technique according to embodiments of the present invention. This diagram is merely an example, which should not unduly limit the scope of the claims. One of ordinary skill in the art would recognize many variations, alternatives, and modifications. For example, one or more steps may be added, removed, repeated, rearranged, modified, replaced, and/or overlapped, which should limit the claims.

Step 601. Upon receiving an FEC block with 21 symbols, the decoder first check the parity symbol to determine whether there are one or more parity errors. In various embodiments, a parity symbol includes an even parity bit for 10 even symbols and an odd parity bit for 10 odd parity symbols. For example, the 10 even symbols are first ten symbols of the FEC block, and the 10 odd symbols are the second ten symbols of the FEC block. For example, Equation 1 is used to perform parity check.

$$\oplus_{i=0}^{9} d_i[0] = d_{20}[0] \oplus d_{20}[1] \quad \text{(par1)}$$

$$\oplus_{i=10}^{19} d_i[0] = pol \oplus d_{20}[1] \quad \text{(par2) Equation 1:}$$

For example, if the parity of the given FEC block is incorrect, the parity inversion flag pol is set.

Step 602. Based on the parity check performed at step 601, the decoder determines whether to perform error correction. For example, if the parity symbol checks out, the decoder simply output the 20 symbols without error correction, and the decoding process proceeds to step 606. On the other hand, if the parity symbol does not check out (e.g., based on Equation 1), error correction is needed, and the process proceeds to step 603.

Step 603. Once it is determined that error correction is to be performed, the decoder needs to locate the erroneous symbol and perform error correction on the erroneous symbol. As explained above, likelihoods of error for the data symbols is selected based their respective LLR values. In various embodiments, a first minimum LLR is determined for the first segment (i.e., first group of ten symbols) of the FEC block and a second minimum LLR is determined for second segment (i.e., second group of ten symbols) of the FEC block.

At step 604, symbols that are most likely to be erroneous ("worst" symbols) are selected. For example, the "worst" symbol(s) are the symbols associated with the lowest LLR values, and respectively there is a worst symbol for the first segment and another worst symbol for the second segment. The selection of "worst" symbols using LLR values is explained above. It is to be appreciated that the "worst" symbols can be selected using other techniques and/or algorithms as well. While there are worst symbols for both the first segment and the second segment of symbols (the term "worst" describes the relative likelihood of being erroneous within a segment), actual error correction or "flip" of worst symbol(s) is performed only if the corresponding parity bits is "off" for the corresponding segment of symbols. Correcting of "flipping" of the worst symbol is performed at step 605.

Figure 7:
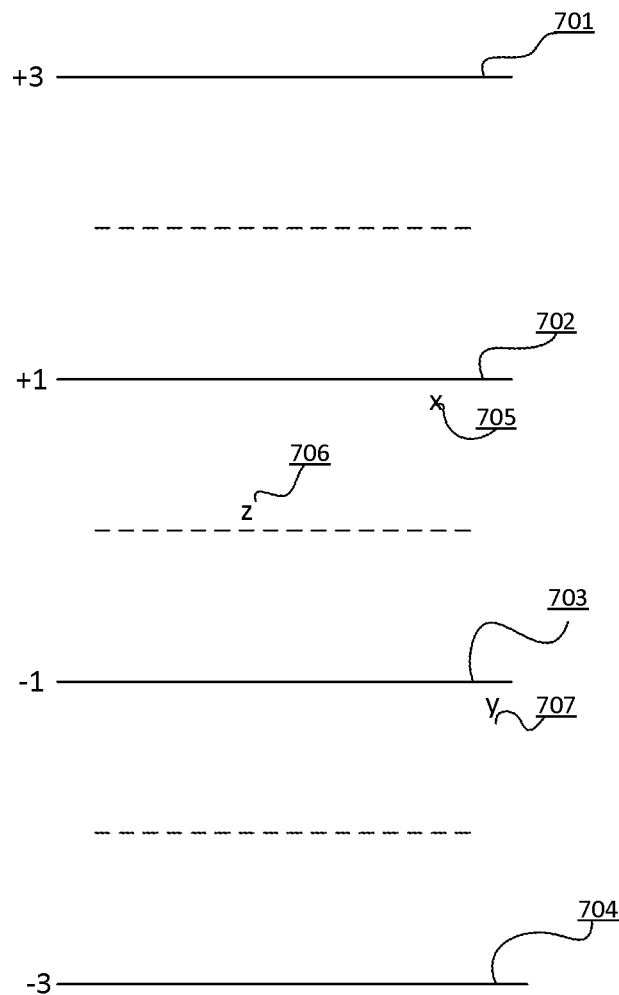
FIG. 7 is simplified eye level diagram according to embodiments of the present invention.

Step 605. At step 605, the worst symbol is changed to its next nearest value. For example, the "flipping" of symbol values can be illustrated and explained in FIG. 7. FIG. 7 is simplified eye level diagram according to embodiments of the present invention. This diagram is merely an example, which should not unduly limit the scope of the claims. One of ordinary skill in the art would recognize many variations, alternatives, and modifications. Four levels (+3 labeled 701, +1 labeled 702, −1 labeled 703, and −3 labeled 704) are provided for PAM4 communication. Each of the incoming data symbols, once decoded, is assigned to one of the four levels. In ideal cases, a data symbol would be very close to one of the four levels and thus easily assigned. For example, symbol "x" 705 is close to level "+1" 702 and is assigned to "+1". Similarly, symbol "y" 707 is close to level "−1" 703 and is assigned to "−1". For a symbol that is close to the middle positions (e.g., three dashed lines between the four levels), the likelihood of symbol error is high. For example, symbol "z" is very close to the middle dash line between level "+1" 702 and level "−1". Assume symbol "z" 707 is processed and decoded correctly, it would be assigned to "+1" 702. However, if the parity bit indicates that there is a wrong symbol, symbol "z" is much more likely to be erroneous than symbols "x" and "y", and thus should be "flipped" to the next nearest level, which is "−1". In such way, the symbols that are closest to the dashed line are the worst symbols. Similarly, for an erroneous symbol positioned between "+1" and "+3", flipping the symbols means changing the symbol value from "+1" to "+3" or the other way around; for an erroneous symbol positioned between levels "−1" and "−3", flipping the symbols means changing the symbol value from "−1" to "−3" or the other way around.

Now referring back to FIG. 6. Depending on the parity check results, one or more "worst" symbols are corrected by flipping to the second nearest PAM level. Once symbol correction is performed, the decoder proceeds to step 606 to output data symbols.

Depending on the implementation, the corrected data symbols are then processed in reverse to the data flow process illustrated in FIG. 2. For example, data symbols are recombined into data streams and RS decoding is later performed.

The decoding/correction processed illustrated in FIG. 7 can be implemented using the pseudo code below:
1. Check the parity equations based on the preliminary decisions. Equation 1 is used to determine par1 and par2.
2. If parities are met, output $(d_i)_{0 \leq i \leq 19}$. If not go to step 3.
3. Calculate the minimum value and index of ALLR i for i=0 . . . 9. Call it $v_0$ (ALLR value) and $i_0$ (index). Do same for ALLR i for i=10 . . . 19, call the results $v_1$ and $i_1$.
4. If par1 is false:
   if $E_{20} == 0$ or $E_{20} == 2$, $(v_0 < ALLR_{20})?\text{flip}(d_{i_0}, E_{i_0})$.
   if $E_{20} == 1$, $\text{flip}(d_{i_0}, E_{i_0})$.
5. if par2 is false:
   if $E_{20} == 0$ or $E_{20} == 2$, $\text{flip}(d_{i_1}, E_{i_1})$.
   if $E_{20} == 1$, $(v_1 < ALLR_{20})?\text{flip}(d_{i_1}, E_{i_1})$.

As an example, the flip(d,E) function above is illustrated in FIG. 7, which is to output the other PAM4 symbol of the eye E and can be implemented using the following pseudo code:
   out[0]=not d[0]
   out[1]=xor(d[1],E[0])

Figure 8:
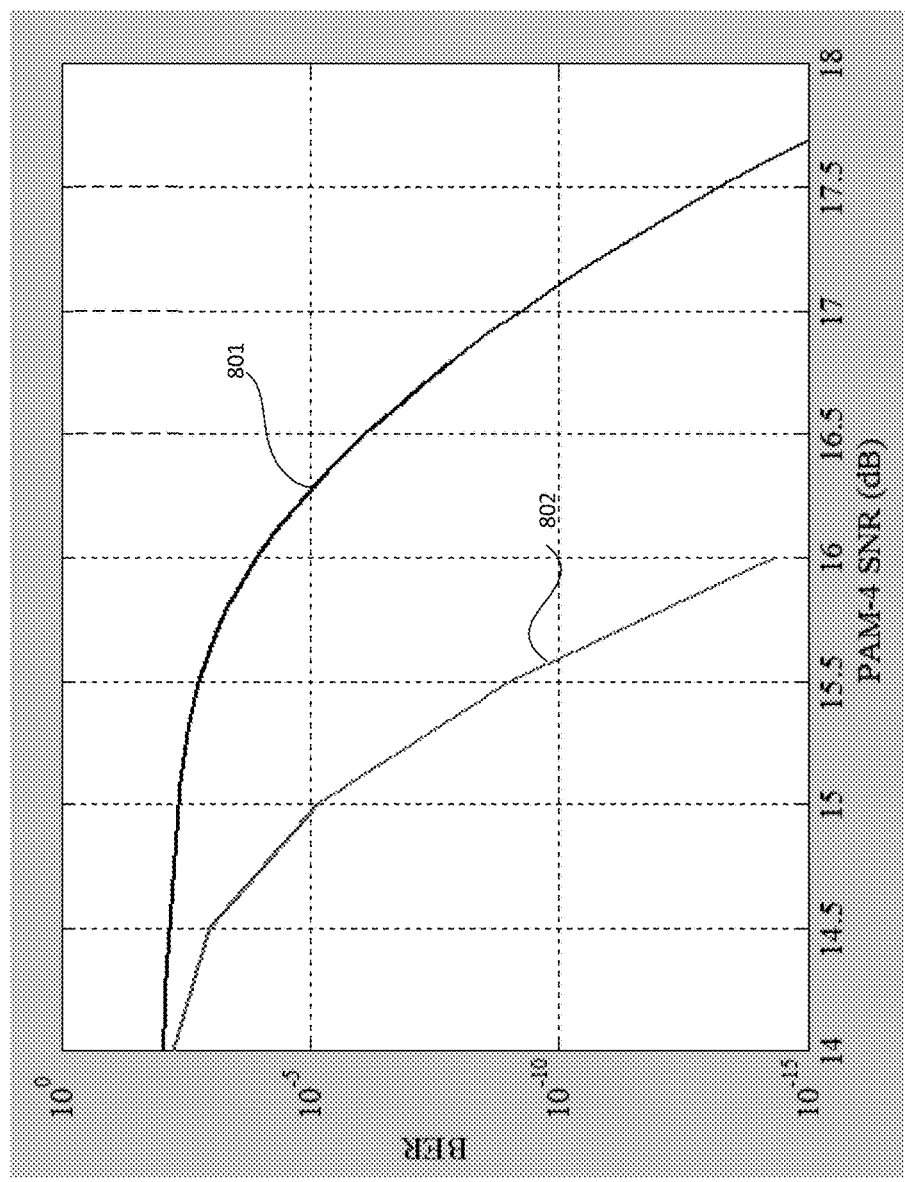
FIG. 8 is a graph illustrating the coding gain obtained by using the parity symbols according to embodiments of the present invention.

It is to be appreciated that the use of parity symbols and correcting "worst" symbols can effectively improve data transmission. FIG. 8 is a graph illustrating the coding gain obtained by using the parity symbols according to embodiments of the present invention. Curve 802 illustrates bit-error-rate (BER) of data transmission when parity symbols are used, and curve 801 illustrates BER when parity symbols are not used. At the same PAM SNR levels, the use of parity symbols can effectively reduce BER and thus improve performance. For example, the use of parity symbols provides a coding gain of 1.65 dB coding gain, or PAM4 SER=3.4E−3. Taking the overhead of adding parity symbol, the net coding gain is about 1.45 dB, which is calculated from 1.65−10 log 10*(21/20). It is also to be appreciated the both encoder and decoder that use the parity symbol can be implemented using power efficient chips.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A data transmission device comprising:
   a first Reed-Solomon (RS) encoder which generates a first data stream, the first data stream being characterized by a first block size;
   a second RS encoder which generates a second data stream, the second data stream being characterized by the first block size;
   a first multiplexer which distributes the first data stream and the second data stream into a first plurality of data streams, the first plurality of data streams including a third data stream and a fourth data stream, the third data stream comprising data blocks from the first data stream and the second data stream;
   a first plurality of communication lanes which transmits the first plurality of data streams;
   a second multiplexer which transmits the first plurality of data streams into a second plurality of data streams, the second plurality of data streams including a fifth data stream, the fifth data stream comprising data blocks from the third data stream and fourth data stream;
   a second plurality of communication lanes which transmits the second plurality of data streams, the second plurality of communication lanes comprising a first communication lane;
   a third multiplexer which splits the fifth data stream into a first odd data stream and a first even data stream;
   a first amplitude modulation (AM) lock module which locks a plurality of odd RS symbols based on the first odd data stream;
   a second AM lock module which locks a plurality of even RS symbols based on the first even data stream; and
   an encoder module for generating a plurality of forward-error correction (FEC) blocks, each of the FEC blocks comprising an odd section and an even section and a parity section, the parity section comprising an odd parity bit corresponding to the odd section and an even parity bit corresponding to the even section, wherein the parity section provides at least 1.5 dB coding gain.

2. The device of claim 1 further comprising a mapping module for mapping the FEC blocks to a sixth data stream.

3. The device of claim 1 wherein the first block size is 10 bits.

4. The device of claim 1 wherein the first plurality of communication lanes consists of eight physical coding sub-layer (PCS) lanes.

5. The device of claim 1 wherein the second plurality of communication lanes consists of four CDAUI lanes.

6. The device of claim 1 wherein the first AM lock module is configured to determine boundaries for RS symbols.

7. The device of claim 1 wherein each of the FEC blocks corresponds to a plurality PAM4 symbols.

8. The device of claim 1 wherein the encoder module is configured to calculate the odd parity bit based on the odd section.

9. The device of claim 1 wherein the device is compatible with the 802.3bs standard.

* * * * *